United States Patent

[11] 3,624,409

[72] Inventors Jerry B. Folsom;
Robert E. Hetzel, both of Loveland, Colo.
[21] Appl. No. 69,366
[22] Filed Sept. 3, 1970
[45] Patented Nov. 30, 1971
[73] Assignee Hewlett-Packard Company
Palo Alto, Calif.

[54] LOGARITHMIC CONVERTER
2 Claims, 1 Drawing Fig.

[52] U.S. Cl. .......... 307/229, 307/230, 328/145
[51] Int. Cl. .......... G06g 7/12
[50] Field of Search .......... 328/145; 307/229, 230

[56] References Cited

UNITED STATES PATENTS 3,506,847 4/1970 Schow .......... 328/145 X
3,524,074 8/1970 Pratt, Jr. .......... 307/230

OTHER REFERENCES

" A Circuit with Logarithmic Transfer Response over (9) Nine Decades," by Gibbons & Horn, Reprint from IEEE Transactions of the Circuit Theory Grp., Vol. CT-11 No. 3, Sept. 1964 pgs. 379- 385 copy in 328/145

*Primary Examiner*—Donald D. Forrer
*Assistant Examiner*—B. P. Davis
*Attorney*—A. C. Smith

ABSTRACT: A logarithmic converter which includes a differential amplifier with one input connected to a logarithmic transfer circuit and another input connected to a temperature compensating reference circuit for producing an output signal from the differential amplifier that is proportional to the logarithm of the ratio of a signal applied to the input of the logarithmic transfer circuit and a reference signal. The logarithmic transfer circuit includes a gain-inverting amplifier having a transistor connected in a feedback arrangement. Resistive elements are connected between the signal input connection, the transistor and a reference potential to improve the linearity of the transfer characteristic.

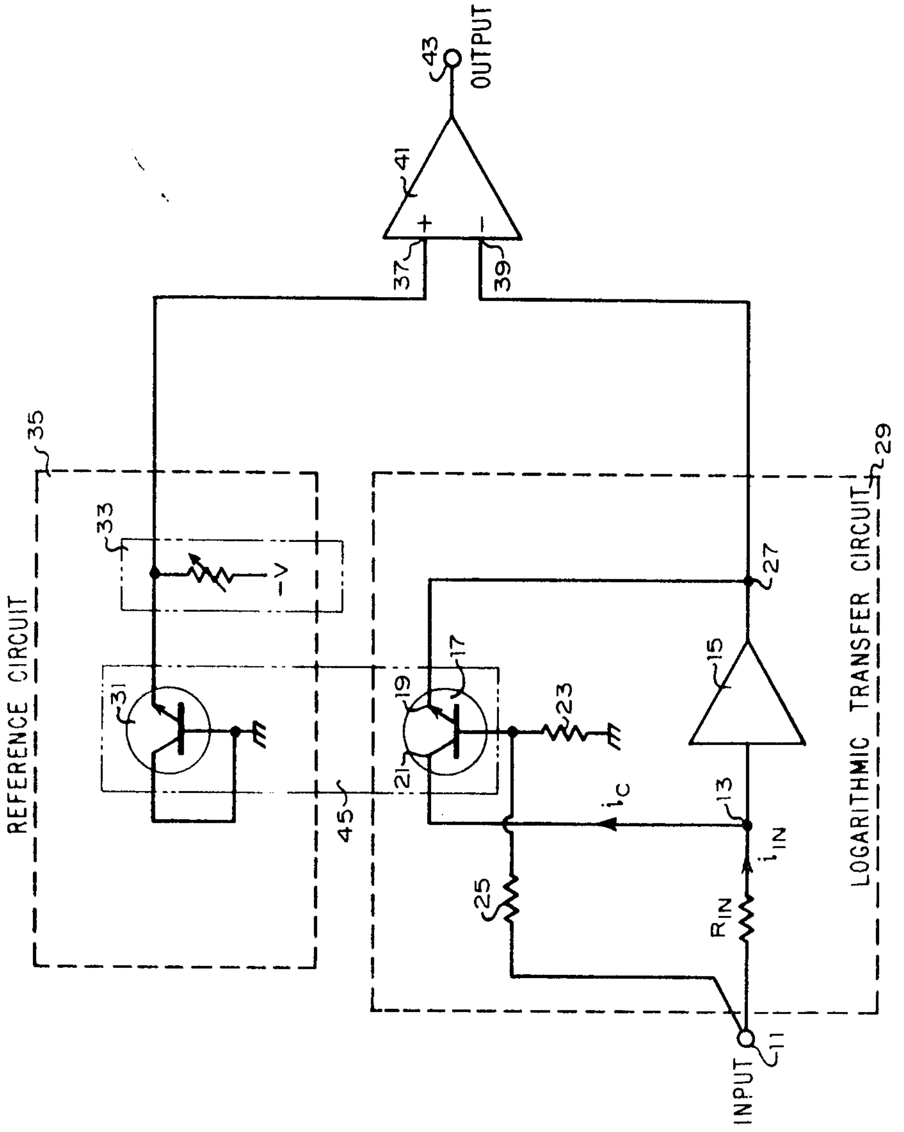
INVENTORS
JERRY B. FOLSOM
ROBERT E. HETZEL

LOGARITHMIC CONVERTER

BACKGROUND OF THE INVENTION

Certain known logarithmic transfer circuits include an amplifier and a transistor arranged such that the emitter of the transistor is connected to the amplifier output, the collector of the transistor is connected to the amplifier input and the base of the transistor is connected to a terminal common to the input and output of the amplifier. Connected in this way the transistor is referred to as a logging transistor. With the voltage across the collector-base junction of the logging transistor near zero and the emitter-base junction of the logging transistor forward biased, the logarithm of a current into the amplifier should be linearly proportional to the output voltage from the amplifier.

However, as the input current is increased lead resistance, contact resistance and bulk resistance in the logging transistor cause a change in the voltage across the emitter-base junction of the logging transistor resulting in deviations from the the logarithmic transfer characteristic.

Temperature variations in the junction of the logging transistor also produce changes in the output voltage. Therefore the junction temperature must be held constant and/or the logarithmic converter must compensate for changes in temperature to make the output independent of temperature.

SUMMARY OF THE INVENTION

The present invention provides an improved logarithmic converter which includes circuitry to adjust the biasing of the logging transistor in response to the input current such that deviations from the logarithmic transfer characteristic are reduced.

First order temperature compensation is achieved by continuously taking the difference between the logging circuit and a temperature compensating reference circuit. Temperature effects are further reduced by fabricating the logging and reference transistors as parts of a monolithic semiconductor chip and by including in that chip a circuit which maintains the chip at a nearly constant temperature, independent of the ambient temperature.

DESCRIPTION OF THE DRAWING AND THE PREFERRED EMBODIMENT

Referring now to the drawing there is shown the improved logarithmic converter having a logarithmic transfer circuit 29, a temperature compensating reference circuit 35 and a differential amplifier 41.

A signal that is applied to input 11 of the logarithmic transfer circuit 29 causes a current $i_{IN}$ to flow through input resistor $R_{IN}$ to input 13 of gain-inverting amplifier 15. Logging transistor 17 has its collector 21 connected to input 13 of amplifier 15 and has its emitter 19 connected to output 27 of amplifier 15. Amplifier 15 supplies at its output 27 a voltage which forward biases the emitter-base junction of logging transistor 17 by an amount necessary to make the collector current $i_c$ essentially equal to the input current $i_{IN}$. The DC voltage gain of amplifier 15 must be sufficiently large to insure that the collector-base junction of logging transistor 17 operates at nearly zero bias.

For a constant temperature, a plot of the logarithm of the collector current of a logging transistor vs. the voltage across the emitter-base junction should be a straight line having a slope $q/kT$, where $q$ is the electronic charge, $k$ is Boltzmann's constant and T is the temperature in degrees Kelvin. As $i_{IN}$ increases, the collector current $i_c$ also increases and because of the lead resistance, contact resistance and bulk resistance of the logging transistor high input currents cause deviations from a linear transfer characteristic. It can be shown that resistor 23 connected between the base of logging transistor 17 and a common ground and resistor 25 connected between the base of logging transistor 17 and input 11 of the logarithmic transfer circuit 29 compensate for the nonlinearity introduced by the lead, contact and bulk resistances of the logging transistor.

Output 27 of amplifier 15 is connected to the inverting input 39 of differential amplifier 41.

Reference circuit 35 includes a reference transistor 31 which has similar characteristics to those of logging transistor 17. The collector and base of reference transistor 31 are connected together and to a common ground to maintain the collector-base junction at zero bias. The emitter of reference transistor 31 is connected to an adjustable bias supply 33 which forward biases the emitter-base junction of reference transistor 31. The emitter of reference transistor 31 is also connected to the noninverting input 37 of differential amplifier 41.

Differential amplifier 41 has inputs 37 and 39 and an output 43 for producing a signal that is proportional to the difference between signals applied at its inputs.

The logging and reference transistors are fabricated on the same monolithic chip and a temperature control circuit within the chip maintains the chip at a constant temperature and thereby keeps the slope $q/kT$ of the transfer characteristic constant. However, any change that does occur in one transistor should also occur in the other transistor and by taking the difference between the outputs of the logarithmic transfer circuit 29 and the reference circuit 35, we compensate for any changes in the junction temperature of the logging transistor.

The converter is adjusted by applying a reference signal ($e_{ref}$) to input 11 and by adjusting either the input resistor $R_{IN}$ or the reference transistor bias supply 33 until the difference between signals applied at inputs 37 and 39 of differential amplifier 41 becomes zero. The reference voltage is removed and an input signal ($e_i$) may then be applied at input 11.

In accordance with the present invention it can be shown that the signal appearing at output 43 of differential amplifier 41 is proportional to the logarithm of the ratio of an input signal $e_i$ to a reference signal $e_{ref}$. The linearity of the transfer characteristic of the logarithmic converter is improved by the addition of resistors 23 and 25 in the logarithmic transfer circuit 29.

We claim:

1. Apparatus for producing an output signal proportional to the logarithm of the ratio of an applied input signal to a reference signal, the apparatus comprising:
   - a gain-inverting amplifier having an output and having an input;
   - a logging transistor having a base, an emitter connected to the output of said gain-inverting amplifier and a collector connected to the input of said gain-inverting amplifier;
   - an input terminal for receiving input signals;
   - a first resistive means connected between said input terminal and the input of said gain-inverting amplifier; and
   - a second and third resistive means, said second resistive means connected between said input terminal and the base of said logging transistor, said third resistive means connected between the base of said logging transistor and a source of reference potential for biasing said logging transistor in response to the magnitude of a signal applied at said input terminal.

2. Apparatus as in claim 1 and including:
   - a reference transistor having similar characteristics to those of said logging transistor, having an emitter and having a base and a collector connected to a common source of reference potential for maintaining a zero bias between collector and base;
   - a voltage supply connected to the emitter of said reference transistor for producing a forward bias on the emitter-base junction;
   - a differencing means having an input to receive signals from said gain-inverting amplifier and from said reference transistor and having an output for producing signals which are proportional to the difference between input signals; and
   - means to maintain the logging transistor and the reference transistor at a constant temperature.

* * * * *